United States Patent [19]

O'Connor et al.

[11] 4,278,458
[45] Jul. 14, 1981

[54] OPTICAL FIBER FABRICATION METHOD AND APPARATUS

[75] Inventors: Paul B. O'Connor, Plainfield; Arthur D. Pearson, Bernardsville, both of N.J.

[73] Assignee: Bell Telephone Laboratories, Incorporated, Murray Hill, N.J.

[21] Appl. No.: 9,935

[22] Filed: Feb. 7, 1979

[51] Int. Cl.³ .................................... C03B 37/07
[52] U.S. Cl. .................................... 65/2; 65/3 A; 65/11 R; 118/712; 118/724; 118/726; 427/8; 427/163
[58] Field of Search .............. 65/2, 3 A, 11 R; 427/8, 427/163, 166, 167; 118/667, 689, 690, 712, 713, 724, 726

[56] References Cited

U.S. PATENT DOCUMENTS

| | | |
|---|---|---|
| 3,775,075 | 11/1973 | Keck et al. ................... 65/3 A X |
| 3,826,560 | 7/1974 | Schultz ........................ 65/3 A |
| 4,017,288 | 4/1977 | French et al. ................. 65/2 |
| 4,148,621 | 4/1979 | Gliemeroth ................... 65/3 A |
| 4,212,663 | 7/1980 | Aslami ......................... 118/726 X |
| 4,217,027 | 8/1980 | MacChesney et al. ....... 65/3 A X |
| 4,220,460 | 9/1980 | Partus .......................... 65/3 A |

FOREIGN PATENT DOCUMENTS 2328670  10/1975  France ................................ 65/3 A Primary Examiner—Richard V. Fisher
Attorney, Agent, or Firm—Samuel H. Dworetsky

[57] ABSTRACT

An optical fiber fabrication method and apparatus are described which are capable of producing reproducible and uniform layers of fiber quality glass. The formation of a saturated stream of glass precursor vapor by condensation allows for the delivery of calibrated predetermined quantities of vapor to an appropriate fiber fabrication apparatus, thereby permitting improved fabrication characteristics.

20 Claims, 2 Drawing Figures

OPTICAL FIBER FABRICATION METHOD AND APPARATUS

BACKGROUND OF THE INVENTION

1. Field of the Invention

This invention is an optical fiber fabrication method and apparatus.

2. Description of the Prior Art

During the past decade significant advances have been made in developing the constituents of a commercially viable optical fiber communication system. Among these constituents are appropriate optical sources, detectors and transmission cables, and in more sophisticated designs, highly complex integrated optical circuitry. One of the earliest developments which allowed for the fabrication of a commercially practical system was the fabrication of a low loss optical fiber for use as the transmission medium. These fibers, made from very pure glass, and in certain embodiments coated with additional protective materials, can now be fabricated with losses as low as 0.5 db/km in the optical and near infrared region of the spectrum. While these fibers may be single mode or multimode, early commercial applications appear to lean toward the multimode variety. In such a multimode fiber, dispersive effects arising from the dependence of the effective velocity of the light on the particular mode in which the light is transmitted have been significantly minimized by fabricating the optical fiber with a radial gradation in index of refraction, which then compensates for the otherwise prevalent mode dispersion phenomenon.

Two major techniques are currently used in the fabrication of optical fibers. One involves the "soot" process described, for example, in U.S. Pat. Nos. 3,775,075 and 3,826,560 assigned to the Corning Glass Works and the other involves the MCVD process described in U.S. Patent Application Ser. No. 828,617 filed on Aug. 29, 1977, now U.S. Pat. No. 4,217,027, by J. B. Mac Chesney and P. B. O'Connor and assigned to Bell Telephone Laboratories, Incorporated. The soot process, as it is most commonly practiced, involves the production of glass precursor particulate material in a flame hydrolysis burner from glass precursor vapors, such as $SiCl_4$ and oxygen, as well as from various additional glass precursor vapors, used for doping purposes, such as $BCl_3$ and $GeCl_4$. The particulate material, usually referred to as soot since it is formed in a flame, is then deposited on a solid cylindrical mandrel which may or may not be a part of the ultimate fiber. If the mandrel is not part of the ultimate fiber, it is removed after deposition. If a graded fiber is required the composition of the deposited material may be varied from layer to layer. Subsequent to deposition, the particulate material is consolidated into a glass by heating to appropriate temperatures in a carefully controlled environment. The resultant "optical fiber preform" is then drawn into an optical fiber.

In the MCVD process, the above-described glass precursor vapors are flowed through a glass tube which is heated. In this environment, the glass precursor vapors react homogeneously to form particulate material. This particulate material is distinguished from the above-described soot in that it is not formed in a flame but is rather formed in a flameless heated environment. Numerous layers are deposited and immediately consolidated to a glass on the inside wall of the tube. Layers of varying composition may be formed if a graded fiber is ultimately required. Subsequent to deposition the structure is collapsed to a solid "optical fiber preform" which is then drawn into an optical fiber.

From this description of the prevalent optical fiber fabrication processes, it may be readily seen that an essential element in both processes involves the delivery of glass precursor vapors to the fabrication apparatus. The rate of fabrication is dependent in part on the rate of such delivery. In addition, the ability to fabricate layers of uniform predetermined composition depends on the ability to deliver glass precursor vapors at specifically controlled concentrations. Heretofore, exemplary delivery systems have included firstly a receptacle containing glass precursors in liquid form, e.g., $SiCl_4$, $GeCl_4$, and $POCl_3$. An appropriate carrier gas such as oxygen is then bubbled through the liquid to vaporize a portion of it and transport it to the fabrication apparatus. In order to be able to determine, readily and quantitatively, the amount of vapor delivered to the fabrication apparatus, the flow of carrier gas must be sufficiently slow so that it becomes saturated with the vapor in the course of passing through the appropriate liquid. Clearly, such a process is limited, by the relatively slow process, in the amount of readily calculable material that it can deliver per unit time.

Recent attempts to increase the amount of vapor capable of being delivered, while retaining the ability to accurately calculate the amount of material so delivered, have centered around increasing the rate of vaporization during the course of bubbling the carrier gas through the appropriate precursor liquid. As mentioned above, during the bubbling process the liquid vaporizes and saturates the carrier gas stream. Since this is an equilibrium process, the bubbling must be sufficiently slow so that the carrier gas will indeed become saturated, thereby permitting simple calculation of the amount of vapor delivered. Improvements on this technique center about increasing the rate at which the vapor enters the carrier gas stream and saturates it. For example, some practitioners heat the liquid through which the carrier gas stream is bubbled so as to speed up this process. Other techniques center about increasing the surface area of the liquid which is contacted by the carrier gas stream thereby increasing the amount of vaporization. Although all of these techniques provide some improvement in the rate at which the vapor can be delivered while still being capable of easy calculation, advantages will accrue if the rate of delivery can be reproducibly increased further while remaining under accurate control.

SUMMARY OF THE INVENTION

This invention is an optical fiber fabrication apparatus capable of producing predetermined quantities of glass reproducibly. The apparatus includes a device capable of producing calibrated quantities of vapor; a means for delivering the vapor without loss; a means for transforming the vapor into a glass, or glass precursor particulate; and a means for forming an optical fiber preform from the glass, and from which an optical fiber is drawn. The quantity of vapor delivered to the vapor transformation means is calibrated by combining an unknown quantity of glass precursor vapor with a carrier gas, and then passing the combination through a condensation column to produce a saturated stream. Knowledge of the condensation temperature, as well as the quantity of carrier gas passed through the unit, allows one to accurately calculate the amount of vapor delivered to the vapor-to-glass transformation device, and hence the amount of glass produced. Both large and small quantities of vapor may be calibrated in this manner and delivered as required. This optical fiber fabrication apparatus allows one to fabricate fibers with highly demanding physical configurations. The apparatus disclosed is capable of producing glass at sufficiently reproducible and calibrated rates to fulfill such stringent requirements.

DETAILED DESCRIPTION OF THE DRAWING

Figure 1:
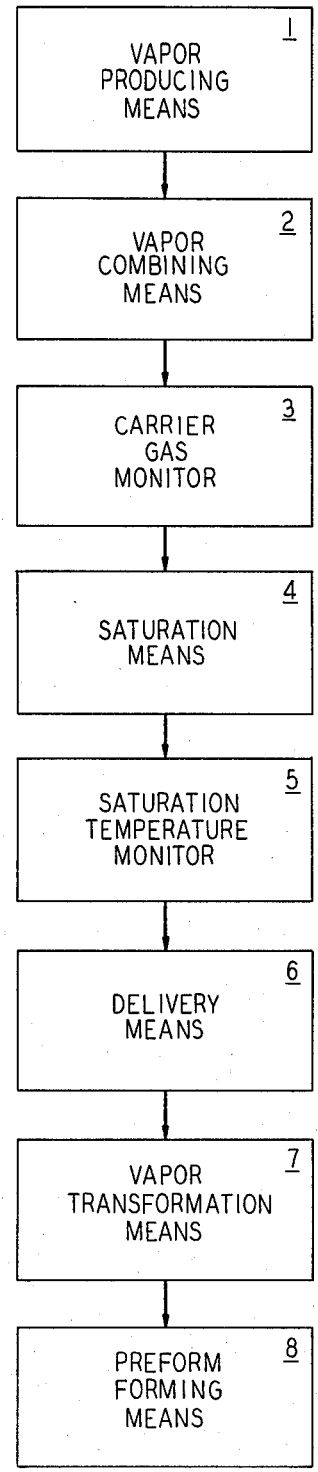
FIG. 1 is a box diagram of the inventive apparatus.

The invention is an optical fiber fabrication apparatus capable of producing optical fibers with highly demanding physical specifications. Glass films with known and reproducible dimensional and compositional characteristics must be formed in the fabrication of such highly sophisticated optical fibers. The apparatus disclosed here enables one to meet such demanding specifications. The invention includes a means for transforming glass precursor vapor into glass, or glass precursor particulate. The vapor delivered to the transformation device is accurately calibrated by one part of the total apparatus disclosed here. Delivery of such calibrated quantities of vapor to the transforming device allows one to predetermine the dimensional and compositional characteristics of the glass layers formed during the optical fiber fabrication. The apparatus naturally includes a means for forming the glass so produced into an appropriate optical fiber preform.

The glass precursor vapor calibration section of the apparatus includes a means for saturating a carrier gas at a given temperature. The saturation characteristics of the vapor in the carrier gas, combined with a knowledge of the quantity of carrier gas transported, allows for the accurate determination of the amount of vapor produced and delivered.

The generic optical fiber fabrication apparatus contains the following elements:

1. A means for producing glass precursor vapor, generally at a temperature greater than a given condensation temperature $T_c$;
2. A means for combining the vapor with a stream of carrier gas, this being done at a temperature greater than $T_c$;
3. Means for monitoring the quantity of carrier gas combining with the said vapor;
4. Means for passing the vapor-gas stream through a region at a temperature $T_c$ to yield a saturated vapor;
5. Means for monitoring the saturation temperature of the saturated gas stream;
6. Means for delivering the resulting vapor to a vapor-to-glass transformation means;
7. Means for transforming the vapor to a glass; and
8. Means for forming the glass into an optical fiber preform.

The elements of the generic invention will now be discussed in detail.

1. Glass-Precursor-Vapor Production Means

As a part of this optical fiber fabrication process, the practitioner must have a source of glass precursor vapor, whose quantity at the source may be undetermined, but whose quantity at the point of delivery will be determined according to the teachings of this invention. The specifics of the initial source of vapor are not critical to the practice of this invention. The vapor source may simply be an appropriate cylinder of the vapor gas in question. Alternatively, the vapor may be produced by heating or even boiling a bath of an appropriate precursor liquid. A specific embodiment, discussed below, involves this heating technique. In this device, large quantities of vapor may be effectively utilized. Such large quantities of vapor may be produced by delivering large amounts of heat energy to the glass precursor liquid. The violent boiling which results, as well as other effects, may produce suspended aerosols in the vapor and the resultant gas-vapor stream. Such aerosols may be removed by appropriate filters, such as columns packed with appropriate trapping material—such as fibers—or precipitators such as electrostatic precipitators.

2. Combining the Glass-Precursor-Vapor With Carrier Gas

The glass precursor vapor, initially provided in the first step of this invention, is then combined with a carrier gas for delivery to a constant temperature region. This combination may occur by any technique known in the art and in the specific embodiment described below is effected by simply introducing the carrier stream above the heated precursor liquid from which the vapor is formed.

3. Monitoring the Carrier Gas Flow

It is important in the practice of this invention to monitor the quantity of carrier gas which is combined with the vapor provided in step 1. In a later step, the carrier gas stream will be saturated with the vapor. A knowledge of the quantity of carrier gas passing through the apparatus, combined with a knowledge of the saturation properties of the vapor-gas stream, will then permit determination of the quantity of vapor ultimately produced.

While the term "monitor" is used here, it is clear that if the quantity of carrier gas combining with the vapor is preset at some known quantity, continuous active monitoring may not be necessary. In such a case, the term "monitor" as used here, will be interpreted as broad enough to encompass such preset flow apparatus.

4. Condensation

The condensation step insures the saturation of the carrier gas stream. In this step the vapor-gas stream is passed through a constant temperature region $T_c$. Either $T_c$, or the amount of vapor introduced into the vapor-gas stream, or both, are adjusted to maintain continuous condensation, thereby insuring that the amount of vapor entering the condensation region is in excess of that required for saturation of the carrier gas stream at the temperature of the constant temperature region. As long as this condensation continues, the practitioner is guaranteed that the resultant stream is saturated and he may consequently determine the absolute quantity of vapor delivered. If the condensation does not occur, the carrier gas is not definitely saturated, and the quantity of vapor produced is not easily determinable. The condensation temperature should remain constant to within values determined by the accuracy required in the quantity of vapor delivered. Alternatively, the amount of carrier gas introduced may be varied to compensate for any change in the saturation temperature.

The condensation region must be carefully distinguished from similar regions used in simple condensers or in exemplary reflux condensers. Neither of those devices are used to produce saturated streams. Rather they are used to remove the condensing liquid from the vapor stream. In this invention similar removal occurs, however the purpose of such removal is to obtain a saturated stream so as to provide a determined quantity of vapor. This motivation results in the distinguishing carrier gas monitor of step 3, and temperature monitor of step 5 which are specifically addressed to the inventive requirements of this process, i.e., determination of the amount of vapor delivered.

5. Temperature Monitoring Means

The ability in the inventive device to accurately calculate the amount of vapor delivered is dependent upon the assumption that the carrier gas is saturated with vapor. As stated above, the observation of condensation guarantees that saturation has taken place. In addition to the actual occurrence of saturation it is important to be able to determine the temperature at which the carrier gas stream is saturated so that one may then calculate from known physical parameters the quantity of vapor in the saturated carrier gas stream. The fifth step in the invention consequently calls for a means for monitoring the saturation temperature of the saturated gas stream.

It must be carefully noted that while the condensation will most likely occur over a region of constant temperature, the region in fact may vary spatially in temperature. If that is the case, the appropriate temperature to be monitored, which we designate as *the saturation temperature*, would be the coolest temperature in the condensation column. If after passing through this region the temperature increases, the carrier gas stream will no longer be saturated. However, the invention will have been effectively practiced if one determines this coolest temperature at which saturation has occurred. In practical embodiments, measurement of the temperature of the exiting gas stream will be sufficiently indicative of the saturation temperature to allow one to effectively practice this invention. The term "saturation temperature" is meant to be sufficiently broad to encompass such a measurement.

It will be noted that if the saturation temperature can be effectively preset, continuous monitoring may not be necessary. In such a case, the term "monitor" as used here, is meant to be broad enough to encompass such embodiments. It should be additionally noted that under certain circumstances, a knowledge of the pressure might be required in order to effectively calculate the quantity of vapor in the saturated carrier gas stream. In many embodiments, the ambient pressure will be assumed. In other embodiments, the pressure of interest will be measured. In certain embodiments, even the fluctuations in pressure will be of interest. Since both the temperature and the pressure may be measured in order to permit calculation of the amount of saturated vapor, any pressure monitoring which is done is meant to be included in the temperature measuring step.

The temperature monitoring step, as well as the carrier gas monitor of step 3, distinguish this technique from prior art condensers which are not addressed to the reproducible production of a predetermined amount of vapor. Prior art techniques are more interested in the condensate which is removed in the constant temperature region. While a saturated gas stream may be inadvertently formed in those prior art processes, the advantages which might accrue from a knowledge of the characteristics of the saturated stream and the application of the device to fiber fabrication had not heretofore been appreciated. Applicants now realize that the saturated stream may be advantageously used to deliver a fixed quantity of vapor to an optical fiber fabrication apparatus. This quantity may be determined by additional inclusion of a gas stream monitor and a condensation temperature monitor so as to determine the quantity of vapor delivered.

6. Delivery Means

The glass-precursor-vapor at this point must be delivered to an appropriate optical fiber preform fabrication apparatus. As discussed above, the composition and quantity of vapor delivered to such an apparatus is of utmost concern. Furthermore, the delivery of increased quantities of vapor without compromising the ability to determine both the composition and the quantity of material delivered can result in more rapid optical fiber fabrication. The invention specifically calls for a means of delivering the vapor generated, and calibrated in the above steps, to an optical fiber preform fabrication apparatus.

The specifics of the delivery means are not critical to the practice of this invention and any means prevalent in the art may be used; for example, simple glass tubing is found to be quite adequate. It should be noted, however, that in order to take full advantage of this device, the delivery system must be designed so as to prevent substantial condensation and subsequent loss of the vapor. Such delivery systems may include simple tubing heated to a temperature greater than $T_c$. Such heating will prevent subsequent condensation. Alternatively, however, further transportation of the vapor may be carried out at temperatures less than $T_c$ if after saturation, the saturated vapor stream is diluted with additional carrier gas thereby lowering its effective condensation temperature, such as to substantially room temperature.

7. Vapor Transformation Means

Before an optical fiber can be formed, the glass precursor vapor must be transformed into an appropriate low loss glass. For most applications, the insertion loss of the glass must be less than 20 db per km. For long distance transmission, the insertion loss is less than 5 db per km. Current ultra-low loss fibers may have insertion losses lower than 1 db per km.

The vapor is transformed to such a low loss glass by any one of a number of means available to the practitioner. Such means currently include a modified chemical deposition apparatus which allows transformation without combustion or a soot apparatus including the exemplary hydrolysis torch which effects transformation using combustion. The modified chemical vapor deposition apparatus effects the transformation by means of an intermediate particulate state. The soot apparatus, likewise, involves a comparable intermediate particulate state sometimes referred to as "soot". When such intermediate states are used, additional consolidation or fining steps must be included to transform the opaque particulate into transparent glass. These techniques are well known and extensively detailed in the prior art. In the event that such steps are necessary, they are meant to be included within this vapor transformation step.

8. Preform Forming Step

The glass which is produced by the vapor transformation means must, of course, be formed into an optical fiber, usually by means of an intermediate preform from which the optical fiber may be drawn. This involves depositing a structure whose configuration is so engineered as to maximize the transmission efficiency of the resulting fiber. These techniqes are well known in the art, and are detailed in references readily available to the practitioner. Inasmuch as the invention allows one to deliver predetermined and reproducible quantities of vapor to the glass transformation means, one can produce predetermined and reproducible layers during the formation of the preform. Therein lies the strength of this particular invention since the size, uniformity and chemical nature of these layers are critical to the loss characteristics of the ultimate fiber. The ability of this invention to allow one to fabricate such layers with higher uniformity and known predetermined physical characteristics will result in fibers of lower loss and more consistent optical characteristics.

Figure 2:
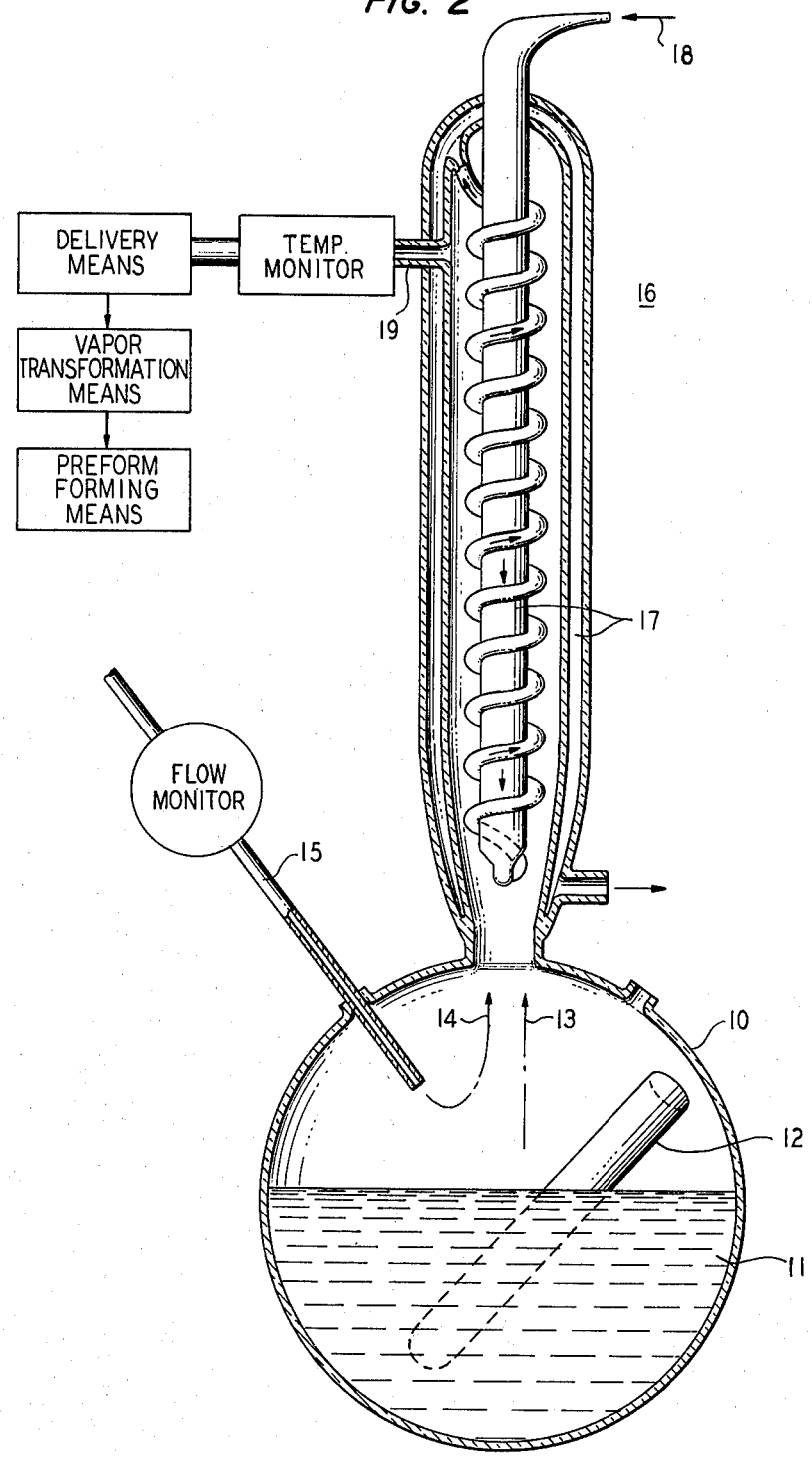
FIG. 2 is a schematic representation of a specific embodiment of FIG. 1.

The elements of the inventive device are shown schematically in FIG. 1. A specific embodiment of FIG. 2 is shown schematically in FIG. 2. In FIG. 2, 10 is an appropriate flask and 11 is a liquid precursor of the glass precursor vapor of interest. A heating element, 12, is used to heat the liquid thereby forming an upward stream of vapor shown schematically as 13. A carrier gas 14 is introduced into the vapor stream by means of inlet 15. The combination of carrier gas and vapor is led through the condensation column 16 which is maintained at a specified temperature $T_c$ by means of a liquid sleeve 17 containing a thermostatically controlled liquid, 18. At 19, the carrier gas exits. Knowledge of the quantity of gas passing through the unit as well as of the saturation properties of vapor-gas system at $T_c$, permits one to calculate the amount of vapor delivered by delivery means, 19.

EXAMPLE

In this example, the embodiment of FIG. 2 was used to deliver appropriate glass precursor vapors to an oxyhydrogen hydrolysis burner in which glass precursor particulates were formed as part of the preform fabrication process.

The embodiment of FIG. 2 was constructed approximately to scale with an overall dimension of approximately 3 feet in height. Gaseous oxygen was used as a carrier gas and was flowed through the device at between 328–352 cc per minute during the course of the approximately 30 minute run. The silicon tetrachloride liquid bath was heated by means of the insert identified in FIG. 2 as 12. A 200 watt heater was placed in the finger to continuously heat the liquid. The temperature of the circulating liquid in the condensation column was maintained so as to yield an output glass-precursor-vapor temperature of between 51.4 and 51.2 C. Under these circumstances, more than 18 grams of silicon tetrachloride were delivered to the hydrolysis torch per minute. The device can deliver more than 30 or even 40 grams of glass precursor vapor per minute. These numbers are of particular interest when it is considered that previous delivery systems unlike this system were able to reproducibly produce no more than 5 or perhaps 10 grams per minute of calculable vapor. The inventive device can deliver more than the prior art devices with greater accuracy. Using the techniques previously discussed, an optical fiber was then formed.

We claim:

1. An optical fiber fabrication apparatus comprising:
   means for producing a glass precursor vapor;
   means for combining said vapor with a stream of carrier gas, said combining taking place at a temperature greater than $T_c$;
   means for monitoring the quantity of carrier gas combined with the vapor;
   means for passing said combination of vapor and carrier gas through a saturation temperature region at a temperature $T_c$ where condensation occurs, to obtain a stream of carrier gas saturated at temperature $T_c$ with the vapor;
   means for monitoring the saturation temperature of the saturated gas stream;
   means for delivering the resulting vapor to a vapor-to-glass transformation means without substantial condensation of the glass precursor vapor; and
   means for transforming the delivered vapor into an optical fiber.

2. The apparatus of claim 1 wherein the vapor production means includes a means for producing a glass precursor vapor at a temperature greater than $T_c$.

3. The apparatus of claim 1 wherein the saturated carrier gas is transported without condensation by means of heated tubes heated to a temperature greater than $T_c$.

4. The apparatus of claim 1 including means for diluting the saturated vapor so that it may be transported at substantially room temperature without condensation.

5. The apparatus of claim 1 wherein the vapor transformation means is an MCVD apparatus.

6. The apparatus of claim 1 wherein the vapor transformation means is a "soot" apparatus.

7. The apparatus of claim 6 wherein the soot apparatus includes an hydrolysis burner.

8. The apparatus of claim 1 including means to heat an appropriate liquid from which glass precursor vapor may be formed.

9. The apparatus of claims 5 or 6 comprising means for producing glass precursor vapor comprising silicon tetrachloride, germania tetrachloride or boron trichloride.

10. The apparatus of claims 5 or 6 comprising means for delivering more than 5 grams of glass precursor vapor per minute.

11. The apparatus of claims 5 or 6 comprising means for delivering more than 10 grams of glass precursor vapor per minute.

12. A method of fabricating optical fibers comprising, producing a glass precursor vapor;
    combining the vapor with a stream of carrier gas at a temperature greater than $T_c$;
    monitoring the quantity of carrier gas combined with the vapor;
    passing the combination of vapor and carrier gas through a substantially constant temperature region at a temperature $T_c$, where condensation occurs, to obtain a stream of carrier gas saturated at temperature $T_c$ with the vapor;
    adjusting the temperature $T_c$, the amount of vapor initially produced, the amount of carrier gas introduced, or combinations thereof, so as to maintain condensation in the $T_c$ temperature region;

monitoring the temperature of the saturated gas stream;

delivering the resulting vapor to a vapor transformation means without substantial condensation of the glass precursor vapor;

transforming the delivered vapor into an appropriate glass; and forming the glass into an optical fiber preform.

13. The method of claim 12 wherein the vapor transformation means is an MCVD apparatus.

14. The method of claim 12 wherein the vapor transformation means is a "soot" apparatus.

15. The method of claim 14 in which the soot apparatus includes an hydrolysis burner.

16. The method of claim 12 wherein the glass precursor vapor is produced at a temperature greater than $T_c$.

17. The method of claim 12 wherein the glass precursor vapor is formed by heating an appropriate liquid.

18. The method of claims 13 or 14 wherein the glass precursor vapor is selected from the group consisting of $SiCl_4$, $GeCl_4$ and $BCl_3$.

19. The method of claims 13 or 14 wherein more than 5 gms of glass precursor vapor is delivered per minute.

20. The method of claims 13 or 14 wherein more than 10 gms of glass precursor vapor is delivered per minute.

* * * * *